(12) United States Patent
Laurent et al.

(10) Patent No.: US 6,376,028 B1
(45) Date of Patent: Apr. 23, 2002

(54) DEVICE AND METHOD FOR TREATING THE INSIDE SURFACE OF A PLASTIC CONTAINER WITH A NARROW OPENING IN A PLASMA ENHANCED PROCESS

(75) Inventors: Jacques Laurent, Blonay; Pierre Fayet, Lausanne, both of (CH); Robert Devidal, Pont-en-Royans (FR)

(73) Assignee: Tetra Laval Holdings & Finance S.A., Pully (CH)

( * ) Notice: Subject to any disclaimer, the term of this patent is extended or adjusted under 35 U.S.C. 154(b) by 0 days.

(21) Appl. No.: 09/509,471

(22) PCT Filed: Sep. 28, 1998

(86) PCT No.: PCT/IB98/01505

§ 371 Date: Jul. 24, 2000

§ 102(e) Date: Jul. 24, 2000

(87) PCT Pub. No.: WO99/17333

PCT Pub. Date: Apr. 8, 1999

(30) Foreign Application Priority Data

Sep. 30, 1997 (CH) ............................................... 2290/97

(51) Int. Cl.⁷ ................................................. H05H 1/02

(52) U.S. Cl. ..................... 427/571; 118/622; 118/623; 118/723 R; 118/723 MW; 118/723 MA; 118/723 I; 118/724; 427/237; 427/238; 427/255.29; 427/255.37; 427/255.393; 427/294; 427/398.1; 427/574; 427/575; 427/579; 427/585; 427/595; 428/336; 428/446; 428/480; 428/688; 428/926

(58) Field of Search ................................. 427/571, 574, 427/575, 579, 585, 595, 237, 238, 255.29, 255.37, 255.393, 294, 398.1; 118/723 R, 723 MW, 723 MA, 723 I, 724, 622, 623; 428/336, 446, 480, 688, 926

(56) References Cited

U.S. PATENT DOCUMENTS 5,378,510 A 1/1995 Thomas et al.
6,180,191 B1 * 1/2001 Felts

FOREIGN PATENT DOCUMENTS

DE 43 18 086 A1 12/1994

(List continued on next page.)

OTHER PUBLICATIONS

XP–002067698, Beschichtung von dreidimensionalen Substraten mit einem magnetfeldunterstützten Mikrowellen-–Plasma bei Raumtemperatur, Jürgen Weichart et al., pp. 22–26, (Summary in English). (No date avail.).
WO 95/22413, Publication Date: Aug. 24, 1995, Hollow Containers with Inert or Impermeable Inner Surface Through Plasma–Assisted Surface Reaction or On–Surface Polymerization.

*Primary Examiner*—Bernard Pianalto
(74) *Attorney, Agent, or Firm*—Rankin, Hill, Porter & Clark LLP

(57) ABSTRACT

The described device is introduced into a plastic container with a narrow opening and serves a plasma enhanced process for treating the inside surface of the container. The device (2) extends between the container opening and the container bottom along the container axis (X) and comprising a gas feed tube (23) for feeding a process gas into the container and permanent magnets (24) for establishing a stationary magnetic field inside the container. The magnets (24) form a column of superimposed magnets which is arranged inside the gas feed tube (23). The north and south poles of each magnet are positioned on opposite sides of the container axis (X). The device may also comprise cooling means (25) for cooling the gas feed tube and the magnets. Preferably the plasma used in the plasma enhanced process is sustained by microwaves or radio frequency waves and the magnets (24) are preferably designed such that electron-cyclotron-resonance conditions are established in an area distanced from the container inner surface by 0 to 30 mm.

18 Claims, 3 Drawing Sheets

FOREIGN PATENT DOCUMENTS

| | | |
|---|---|---|
| EP | 0 299 754 B1 | 1/1989 |
| EP | 0 667 302 A1 | 8/1995 |
| EP | 0 668 219 A1 | 8/1995 |
| JP | 07041579 A | 2/1995 |

\* cited by examiner

DEVICE AND METHOD FOR TREATING THE INSIDE SURFACE OF A PLASTIC CONTAINER WITH A NARROW OPENING IN A PLASMA ENHANCED PROCESS

The invention lies in the field of the packaging industry and relates to a device according to the generic part of the first independent claim. The device serves for carrying out a plasma enhanced process in a plastic container with a narrow opening in order to treat the inside surface of the container. Furthermore, the invention relates to a method of a plasma enhanced treatment using the inventive device and to containers produced according to the process.

Plasma enhanced processes used for treating the inside surface of plastic containers are e.g. plasma enhanced chemical vapour deposition processes for producing an inside coating of e.g. silicon oxide which coating reduces gas permeability of the plastic material. Plasma enhanced processes can further be used e.g. for activating the inside surface, for changing its wetability or for sterilizing the inside of the container. The constraints put on such processes and on the devices for carrying out such processes when applied to the inside of plastic containers used for packaging purposes and having a narrow opening such as e.g. bottles for beverages, are caused mainly by the temperature sensitivity of the plastic material, by the narrowness of the opening, i.e. the difficult accessibility of the surface to be treated and by the necessary small economic value of such containers.

From the publication EP-299754 (BOC Group) it is known that by coating plastic materials with a layer of silicon oxide, the gas permeability of such materials can be reduced considerably. The same publication discloses a plasma enhanced chemical vapour deposition process for producing such silicon oxide coatings.

From the publications EP-668219 and EP-667302 (Tetra Pak) it is further known that silicon oxide coatings produced by plasma enhanced chemical vapour deposition and having a composition of SiOx, whereby x ranges between 1.8 and 2.2, have superior gas barrier properties and that such coatings with a thickness which is less than 0.2 $\mu$m (2000 Angström) provide a stopped here gas barrier which is satisfactory for most applications in food and beverage packaging.

It is known e.g. from the publication by J. Weichart, B. Meyer and J. Müller (Vakuum in der Praxis Nr.1, pages 22 to 26, 1991) that a plasma excited by microwave exhibits a higher electron density and higher electron energy than a plasma excited by direct current or by high frequency. Therefore, using a microwave plasma results in higher deposition rates for chemical vapour deposition processes. In a microwave plasma positioned in a static magnetic field the electron loss through diffusion is reduced and energy take-up by electrons is increased. This effect is due to magnetic confinement in which electrons are accelerated on paths around magnetic field lines creating within the microwave plasma electron-cyclotron-resonance conditions. Such conditions are fulfilled for a microwave frequency of 2.45 GHz and a pressure of less than 10 Pa in a static magnetic field of a magnetic flux density of 87.5 mT. Under such conditions it is possible to sustain a plasma with a much smaller power input than needed for e.g. a high frequency plasma In the same publication an apparatus for coating the inside surface of bottles is proposed in which apparatus the microwave field is produced by a helical Wanderfeld antenna and the bottle is placed within the helix. The magnetic field is produced by permanent magnets arranged on the inside of the bottle along a gas feed tube which extends along the bottle axis.

In the same publication it is stated that silicon oxide coatings produced with a microwave plasma at electron-cyclotron-resonance conditions in the apparatus as described do not show permanent good barrier properties due probably to great hardness and brittleness.

In a plurality of more recent publications (e.g. Polar materials U.S. Pat. No. 5,378,510, Coca-Cola Company WO-95/22413, Toyobo JP-07041579), the inside coating of bottles with silicon oxide has again been described. As plastic bottles with an inside coating of silicon oxide are not available on the market, it can be concluded that up to now it has not been possible to produce the bottles with a satisfactory quality and/or with an effort which can be kept within reasonable limits.

It is therefore the object of the invention to show a device and a method for treating the inside surface of plastic containers having a narrow opening (e.g. bottles with an opening of 28 to 38 mm diameter) in a plasma enhanced process, e.g. coat this inside surface with silicon oxide using a plasma enhanced chemical vapour deposition process. Using the inventive device is to make it possible to ignite and sustain on the inside of the container a plasma possibly under electron-cyclotron-resonance conditions such that the plasma enhanced treatment compared to known such treatments is improved regarding quality of the treatment (e.g. quality of the resulting coating) and at the same time regarding energy and time consumption.

This object is achieved by the device and the method as defined by the claims.

The inventive device has the form of a finger and is introduced into the container to be treated through its opening. For being able to be introduced, it has a diameter which is less than the diameter of the container opening. In the container it extends substantially along the container axis, its connecting end passing through the container opening and being connected to appliances outside of the container and its distal end facing the container bottom opposite the container opening.

The device comprises means for feeding the process gas as uniformly as possible to the inside of the container and means for establishing a static magnetic field with closed field lines within the container such that the loaded particles, in particular the electrons created in a plasma are induced to rotate between the area of the container opening and the area opposite the container opening. Thereby, the magnetic field is advantageously of such a magnitude that electron-cyclotron-resonance conditions are possible within the container. The device may further comprise cooling means for cooling the means for feeding the process gas and if applicable the means for establishing the magnetic field.

The device is to be connected to a source of a process gas for supplying the process gas to the gas feed means. If applicable, the device is further to be connected for supply and removal of a cooling medium. The connecting end of the device passing through the container opening is designed such that it occupies as little of the container opening as possible. This makes it possible to evacuate and vent the container very efficiently.

The inventive device is preferably used in connection with a plasma sustained by microwave or radio frequency electromagnetic waves, i.e. by electromagnetic waves of frequencies in the range of ca. 30 KHz to several GHz, whereby the electromagnetic waves are coupled into a confinement in which the container to be treated is positioned by suitable coupling methods and means (hollow conductor, capacitive coupling or inductive coupling).

A container is treated on its inside in a plasma enhanced process by e.g. introducing the container into a microwave confinement, which confinement is equipped such that an advantageously stationary microwave can be established within the confinement. The device as described above is introduced into the container, the connecting end passing through the container opening substantially axially. Then the inside and outside of the container is evacuated, whereby on the inside of the container a pressure is created which is low enough for igniting a plasma. Microwaves are coupled into the microwave confinement and the process gas is flown through the gas feed means into the inside of the container and is pumped from the container such that a low operation pressure is maintained. After the reaction time the microwave is stopped, the system vented, the inventive device removed from the container and the container removed from the microwave confinement.

In case of a multi-step plasma enhanced treatment the process gas is changed after each step.

BRIEF DESCRIPTION OF THE DRAWINGS

Exemplified embodiments of the inventive device and an example of a method using the device are described in connection with the following Figures. Thereby.

DETAILED DESCRIPTION OF THE DRAWINGS

Figure 1:
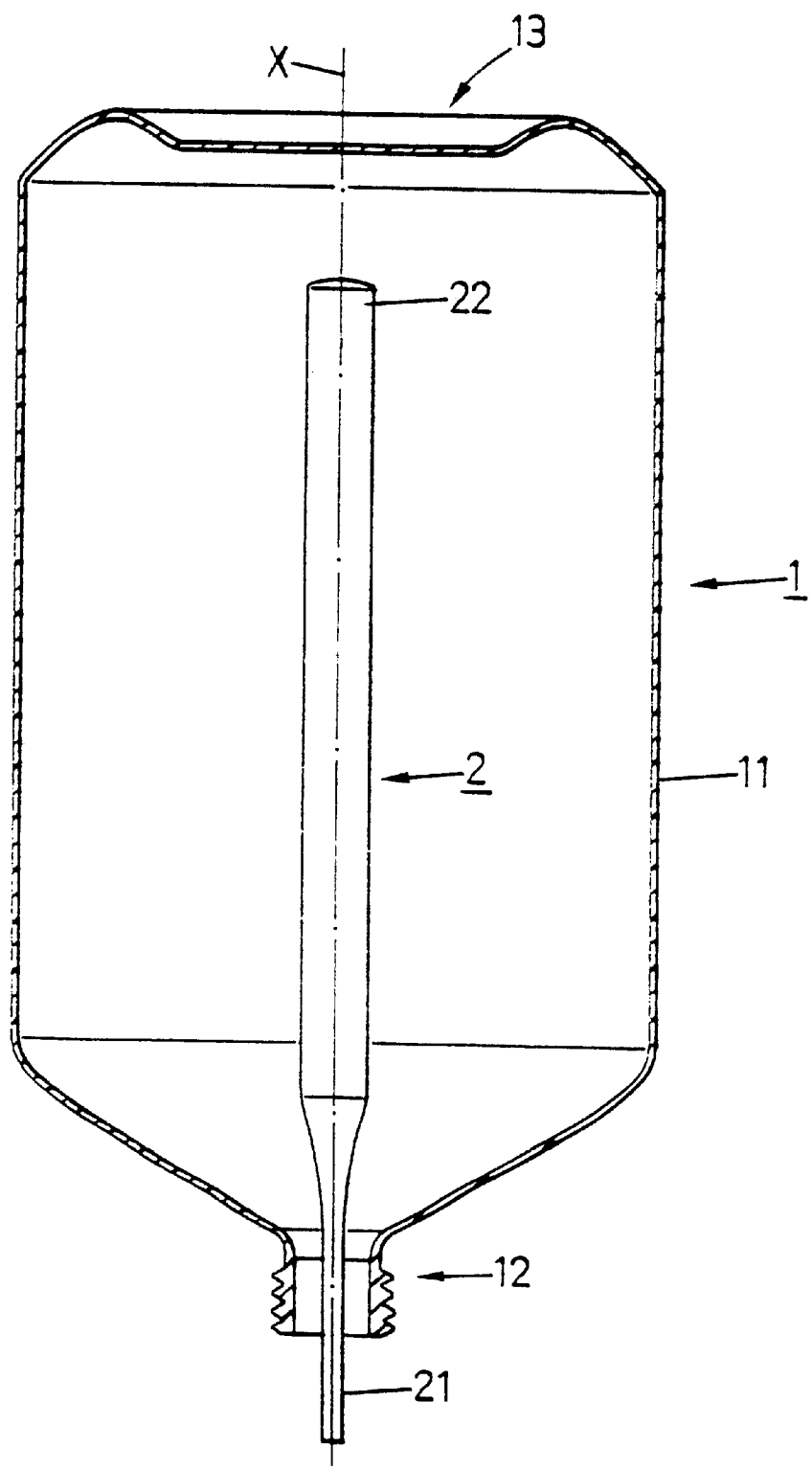
FIG. 1 shows an inventive device, introduced into a bottle to be treated in a plasma enhanced process in section along the bottle axis.

FIG. 1 shows as an example of a plastic container having a narrow opening and to be treated in a plasma enhanced process, a plastic bottle 1 having a substantially cylindrical body 11, having a neck portion 12 with an opening and e.g. with a thread and a neck ring and having a bottom portion 13 opposite the neck portion.

The inventive device 2 extends from the opening of the container (connecting end 21) towards its bottom whereby the distal end 22 of the device does not touch the container bottom 13. Usually the device 2 extends along the container axis X.

Furthermore, the inventive device may serve as one of the electrodes for capacitive coupling of the electromagnetic waves and in such a case comprises a metallic gas feed tube connected to a corresponding electrical power source or possibly to ground.

Figure 2:
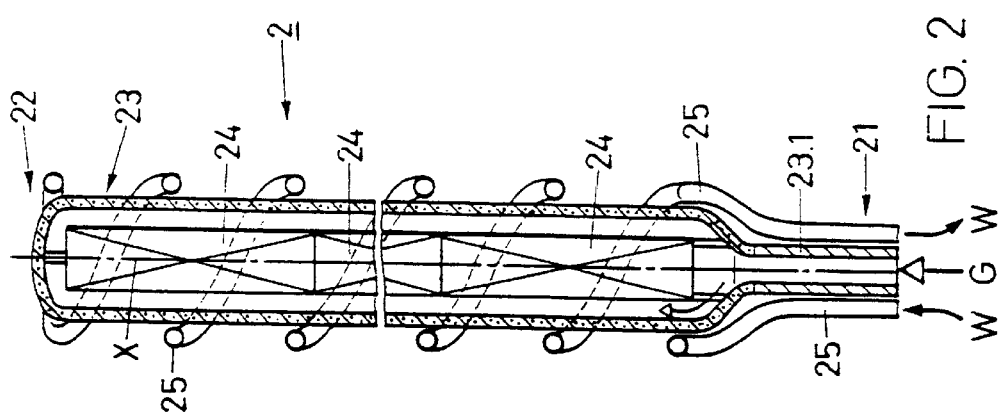
FIG. 2 shows in more detail an exemplified embodiment of the inventive device in section parallel to the axis.

FIG. 2 shows an exemplified embodiment of the inventive device 2 in section parallel to the axis X and in more detail. The device 2 comprises as gas feed means a gas feed tube 23 which is closed at the distal end of the device and is made of a porous material such as e.g. of a sintered metal or of a solid material which is perforated by a great number of openings. The gas feed tube 23 has a narrowed end portion 23.1 facing towards the connecting end 21 of the device which narrowed end portion 23.1 is preferably not porous or does not have any perforations. The process gas G is supplied to the gas feed tube 23 through the open end of its narrowed end portion 23.1.

As means for creating a stationary magnetic field, the device comprises on the inside of the wider part of the gas feed tube 23 a plurality of superimposed permanent magnets 24. These magnets 24 are such designed that their north and south poles are situated on opposite sides of the axis X.

A double helix cooling tube 25 is arranged around the gas feed tube 23 and serves as a cooling means. The ends of the helix tube 25 together with the narrow end section 23.1 of the gas feed tube 23 form the connecting end of the device passing through the container opening. A cooling means W e.g. water serves for keeping the temperature of the device and in particular of the magnets 24 constant within very narrow limits, whereby the induction (magnitude of the magnetic field) being a very temperature dependent value is kept constant within very narrow limits also. The optimum temperature is slightly higher than ambient temperature such that condensation of any of the components of the process gas is prevented.

Figure 3:
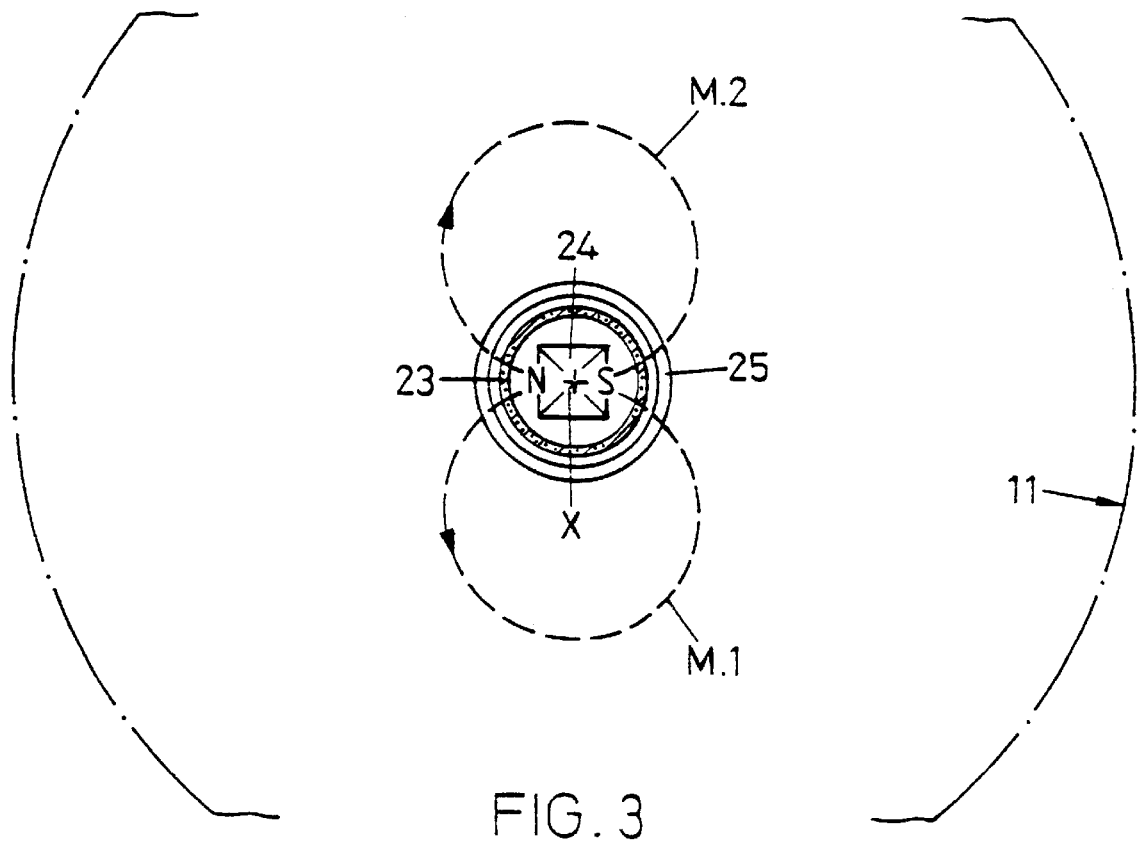
FIG. 3 shows in section perpendicular to the axis the device according to FIG. 2.

FIG. 3 shows in cross section perpendicular to the axis X the device according to FIG. 2 with the gas feed tube 23, the magnets 24 and the cooling means 25. The poles of the magnets 24 positioned on opposite sides of the axis X are designated with N and S. Two exemplified closed field lines of the magnetic field created by the magnet 24 are shown and designated with M.1 and M.2, whereby M.1 and M.2 are directed from north to south pole. The field lines created by the superimposed magnets (FIG. 2) are superimposed in the same way. The body 11 of the container to be treated is indicated by a broken line.

The magnets applicable for the inventive device are e.g. ferrite or cobalt-samarium magnets (e.g. by UGIMAG FR). The column of superimposed magnets shown in FIG. 3 has a square cross section. This cross section may be rectangular (FIG. 4) or round (FIG. 2) also. For microwaves with a frequency of 2.45 GHz and for a pressure of less than 10 Pa, electron-cyclotron-resonance occurs in areas of the magnetic field where the magnetic flux density is 87.5 mT. For achieving such conditions the magnets need to be designed such that the magnetic field outside of the tubes 23 or 25 has the corresponding flux density (87.5 mT).

Through the magnetic field illustrated by the field lines M.1 and M.2 electrically loaded particles in particular free electrons are accelerated in a direction parallel to the axis X in opposite directions on opposite sides of the magnets, i.e. they are driven in a rotating manner around the length of the column of superimposed magnets. Such rotation of the electrons within the plasma reduces electron loss due to diffusion. It shows that conditions for coating the inside surface of a container are best with magnets which are designed such that electron-cyclotron-resonance conditions are established at a distance of 0 to 30 mm from the inside container surface.

Figure 4:
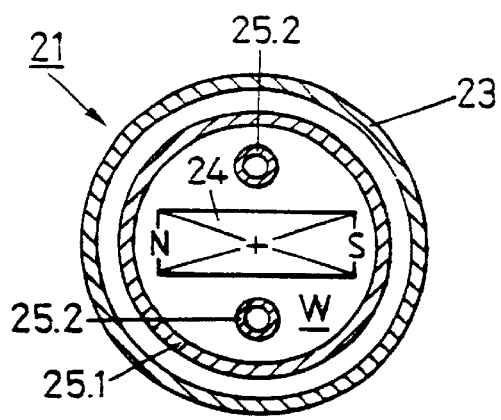
FIG. 4 shows a further exemplified embodiment of the inventive device in section perpendicular to the axis.

FIG. 4 shows in section perpendicular to the axis a further embodiment of the inventive device. This device comprises again means for feeding a process gas to the inside of the container (gas feed tube 23), means for establishing a stationary magnetic field (permanent magnet 24 with north and south pole on opposite sides of the axis) and cooling means (25.1 and 25.2). For cooling a cooling tube 25.1 within the gas feed tube 23 is provided and the magnets are positioned within the cooling tube and are immersed in the cooling medium. The cooling medium W is fed to the cooling tube through e.g. two feed tubes 25.2 extending from the connecting end of the device and having open ends in the area of the closed distal end of the cooling tube. The cooling medium is removed from the cooling tube in the area of the connecting end of the device. The cooling tube 25.1 with the magnets arranged within is arranged inside the gas feed tube 23.

As an example for a plasma enhanced process for treating the inside surface of a plastic container with a narrow opening, the inside coating of a bottle made by stretch blow moulding of polyethyleneterephthalate with silicon oxide is described in the following. The specific bottle has a volume of ca 500 ml and an opening of 38 mm diameter. It weighs 18 to 32 gr (bottle of specific example below: 32 g).

The device introduced into the bottle has a diameter of ca. 20 mm (applicable for bottles with a standard opening of 28 mm also). The length of the device is chosen such that the distance between the distal end of the device and the bottom of the bottle is kept at ca. 30 mm. The magnets of the device are made of cobalt-samarium and have a cylindrical form with a diameter of 12 mm and a height of 40 mm.

The bottle is introduced in a substantially cylindrical microwave containment which may serve at the same time as vacuum chamber. The microwaves used have a frequency of 2.45 GHz. They are produced by a microwave generator and are coupled to the microwave confinement via a hollow wave guide which opens into the cylindrical confinement axially or radially. The confinement, the generator and the wave guide are advantageously such designed and tuned that there is a stationary microwave inside the confinement. The average microwave power ranges from 100 to 600 Watts (advantageously: 300 W).

The bottle to be coated is positioned inside the microwave confinement and the inventive device connected to gas supply and cooling medium supply and removal is positioned in the bottle. The bottle opening is connected to a vacuum pump. The vacuum chamber and the inside of the bottle are evacuated simultaneously to a base pressure of approximately 0.5 Pa which base pressure is preferably somewhat lower than the operating pressure. For preventing a plasma being ignited on the outside of the container, it is advantageous to reduce the pressure on the outside of the container to a value which is about ten times lower than the process pressure. A plasma is ignited inside the container by activating the microwave generator and the process gas consisting of oxygen and an organosilicon compound (e.g. hexampthyldisiloxane) in a volume ratio of between 5:1 to 30:1 (preferably 10:1) is flown through the container with a flow rate of 10 to 100 sccm (preferably 22 sccm) whereby the operating pressure is kept in a range between 10 Pa to 0.1 Pa (preferably at 5 Pa). The process gas may further comprise an inert gas.

After a coating time of 5 to 20 s (preferably 15 s) power and gas flow are stopped, the bottle and the vacuum chamber are simultaneously vented and the coated bottle is removed from the microwave confinement, The silicon oxide coating achieved in a coating process as described above has a minimum thickness of 5 nm and may be as thick as approximately 50 nm. Preferably it is 30 nm.

Figure 5:
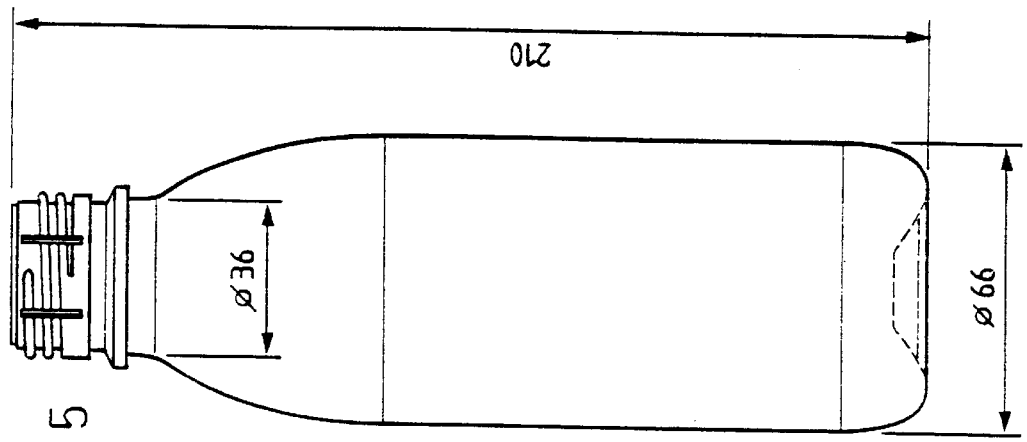
FIG. 5 shows the bottle coated with silicon oxide according to the given example of a plasma enhanced process for treating the inside surface of plastic containers.

The PET-bottle illustrated in FIG. 5 was subjected to the treatment as described above with the parameters indicated in parentheses as preferable parameters. The coating had a thickness of approximately 30 nm. The uncoated bottle had a measured oxygen permeability of 0.060 ccm/bottle/day/ 0.2 atm (23° C., 50% relative humidity). The coated bottle had a measured oxygen permeability of 0.012 ccm/bottle/ day/0.2 atm (23° C., 50% relative humidity). This shows that coating the bottle using the inventive device and the parameters as given above gives an improvement in gas permeability for oxygen of a factor 5. A comparison between the coated bottle and a similar but uncoated bottle when filled with a carbonated drink showed a pressure loss which was smaller by a factor between 2 and 3 for the coated bottle.

The silicon oxide layer consisted of 67.5% O, 29.0% Si and 3.5% C. The composition of the coating can be varied by varying the composition of the process gas.

The surprising result of the coating process as described above is illustrated by comparing the above results with the disclosure by J. Weichart et al. (see above) of silicon oxide coatings not improving the gas permeability and also by comparing the above results with the high frequency coating and its results described in U.S. Pat. No. 5,378,510 (Polar Materials): with a frequency of 450 kHz, an energy input of 80 W, a gas flow of 44 sccm (nitrous oxide: hexamethyldisiloxane 10:1) and a coating time of two minutes, a permeability improvement by a factor of 2.25 is achieved.

The inventive device and the inventive method are applicable as described above for containers of different sizes and shapes, whereby the device to be positioned inside the bottle is to be adapted to the axial length (distance between opening and bottom) of the container and the gas flow is to be adapted to the size of the container. The container body does not necessarily have to be cylindrical. Small deviations from a cylindrical shape as well as cross sections e.g. representing a regular square or hexagon can be treated with the same good results. For containers showing greatly varying distances between the inside surface and the inventive device might have to be treated slightly longer.

The bottle and its treatment as described above are one example. As indicated in the beginning, other plasma enhanced processes than coating processes are possible and the treated container may be made from a different plastic material, e.g. from polypropylene or from polyethylene (PP), in particular from high density polyethylene (HDPE).

All modifications, alterations and changes coming within the spirit and scope of the invention as set forth in the appended claims are herein meant to be included.

What is claimed is:

1. A device to be positioned in a plastic container (1) with a narrow opening and with a container axis (X) passing through the container opening for treating the inside surface of the plastic container in a plasma enhanced process, the device (2) extending substantially along the axis (X) of the container with a connecting end (21) passing through the container opening and a distal end (22) extending towards the container bottom opposite the container opening, the device comprising a gas feed tube (23) made of a porous material or of a perforated material for feeding a process gas into the container and means (24) for establishing a stationary magnetic field in the container, wherein the means for creating the stationary magnetic field is arranged inside the gas feed tube (23) and comprise at least one permanent magnet whereby a north pole and a south pole of said at least one magnet are positioned on opposite sides of the container axis (X).

2. The device according to claim 1, wherein said device further comprises cooling means.

3. The device according to claim 2, wherein the cooling means comprise a cooling tube (25.1), which is arranged inside the gas feed tube (23, whereby said at least one magnet is immersed in a cooling medium circulating through the cooling tube (25.1).

4. The device according to claim 3, wherein the cooling medium is fed into the cooling tube (25.1) through at least one feed tube (25.2), which extends inside the cooling tube (25.1) and has an open end near a closed distal end of the cooling tube (25.1).

5. The device according to claim 2, wherein the cooling means comprises a double helix cooling tube (25) surrounding the gas feed tube (23).

6. The device according to claim 1, wherein said at least one magnet is a column of a plurality of superimposed magnets, said column of permanent magnets (24) consists of a plurality of cobalt-samarium magnets.

7. The device according to claim 6, wherein the permanent magnets (24) are cylindrically-shaped and have a diameter of approximately 12 mm and a height of approximately 40 mm.

8. The device according to claim 1, wherein the distal end of the device is spaced from an inside surface of the container to be treated.

9. A method for plasma enhanced treatment of an inside surface of a plastic container with a narrow opening and a container axis (X) passing through the container opening, comprising the steps of:
    positioning a device according to claim 1 in the container;
    igniting and sustaining a plasma in the container by means of electromagnetic waves, wherein a frequency of the electromagnetic waves and said permanent magnets are adapted to each other and cooperate such that there are electron-cyclotron-resonance conditions in the container in an area spaced from the inside surface of the container body by 0 to 30 mm.

10. The method according to claim 9, wherein the electromagnetic waves have a frequency selected from the group consisting of microwave frequency range and radio frequency range.

11. The method according to claim 9, wherein the plasma enhanced treatment is a plasma enhanced chemical vapor deposition process for coating the inside surface of the container with a silicon oxide layer.

12. The method according to claim 11, wherein the plastic container is a PET bottle and wherein the plasma enhanced chemical vapor deposition process is continued until the coating has a thickness of at least 5 nm.

13. The method according to claim 12, wherein in order to reduce oxygen permeation of a coated bottle, as compared to an identical but uncoated bottle, by a factor of 5, the chemical vapor deposition process is continued until the coating has a thickness of 30 nm.

14. The method according to claim 9, wherein process parameters are: microwave frequency 2.45 GHz, power 300 W, process gas comprising oxygen and an organosilicon compound in a volume ratio of 10:1, flow rate of the process gas 22 sccm, operating pressure 5 Pa, coating time 15 s.

15. The method according to claim 9, wherein a temperature of the device is kept constant by circulating a cooling medium (W) through said device.

16. The method according to claim 15, wherein process parameters are: microwave frequency 2.45 GHz, power 300 W, process gas comprising oxygen and an organosilicon compound in a volume ratio of 10:1, flow rate of the process gas 22 sccm, operating pressure 5 Pa, coating time 15 s.

17. The method according to claim 15, wherein method parameters are: microwave frequency 2.45 GHz, power 100 to 600 W, process gas comprising oxygen and an organosilicon compound in a volume ratio of between 5:1 to 30:1, flow rate of the process gas 10 to 100 sccm, operating pressure between 10 Pa to 0.1 Pa, coating time of 5 to 20 s.

18. The method according to claim 9, wherein method parameters are: microwave frequency 2.45 GHz, power 100 to 600 W, process gas comprising oxygen and an organosilicon compound in a volume ratio of between 5:1 to 30:1, flow rate of the process gas 10 to 100 sccm operating pressure between 10 Pa to 0.1 Pa, coating time of 5 to 20 s.

* * * * *

UNITED STATES PATENT AND TRADEMARK OFFICE
CERTIFICATE OF CORRECTION

PATENT NO. : 6,376,028 B1
DATED : April 23, 2002
INVENTOR(S) : Laurent et al.

It is certified that error appears in the above-identified patent and that said Letters Patent is hereby corrected as shown below:

Column 6,
Line 63, delete "(23)," and insert -- (23), --.

Column 7,
Line 2, delete "(25.1)" and insert -- (25.1), --.

Signed and Sealed this

Twenty-ninth Day of October, 2002

Attest:

Attesting Officer

JAMES E. ROGAN
Director of the United States Patent and Trademark Office